United States Patent
Sakata et al.

[11] Patent Number: 5,977,701
[45] Date of Patent: Nov. 2, 1999

[54] COLOR CATHODE RAY TUBE WITH IMPROVED TRANSMITTANCE OF SELECTIVE WAVELENGTHS

[75] Inventors: Atsushi Sakata, Kanagawa; Tomohisa Uba, Tokyo; Shigeo Ando; Masaru Nagashima, both of Kanagawa, all of Japan

[73] Assignee: Sony Corporation, Japan

[21] Appl. No.: 08/765,197

[22] PCT Filed: Apr. 17, 1996

[86] PCT No.: PCT/JP96/01041

§ 371 Date: Apr. 3, 1997

§ 102(e) Date: Apr. 3, 1997

[87] PCT Pub. No.: WO96/36064

PCT Pub. Date: Nov. 14, 1996

[30] Foreign Application Priority Data

May 9, 1995 [JP] Japan ..................... 7-110847

[51] Int. Cl.[6] ..................... H01J 31/00
[52] U.S. Cl. ..................... 313/478; 313/480
[58] Field of Search ..................... 313/467, 480, 313/478, 479, 64; 501/70, 71, 72

[56] References Cited

U.S. PATENT DOCUMENTS

| | | | |
|---|---|---|---|
| 4,065,696 | 12/1977 | Steierman | 313/480 |
| 4,376,829 | 3/1983 | Daiku | 501/64 |
| 4,390,637 | 6/1983 | Daiku | 501/64 |
| 4,405,881 | 9/1983 | Kobayashi | 313/480 |
| 4,728,856 | 3/1988 | Iwasaki et al. | 313/467 |
| 5,543,685 | 8/1996 | Okamoto et al. | 313/496 |
| 5,656,560 | 8/1997 | Stotzel et al. | 501/72 |

FOREIGN PATENT DOCUMENTS

| | | |
|---|---|---|
| 0041 339 | 12/1981 | European Pat. Off. . |
| 54-62770 | 5/1979 | Japan . |
| 56-168324 | 12/1981 | Japan . |

*Primary Examiner*—Vip Patel
*Assistant Examiner*—Matthew J. Gerike
*Attorney, Agent, or Firm*—Rader, Fishman & Grauer; Ronald P. Kananen

[57] ABSTRACT

An object of the present invention is to provide a CRT for improving brightness without changing a conventional electron gun, a light emitting layer, etc.

A color cathode ray tube according to the present invention is characterized in that both or one of a panel glass 3 and a safety glass 1 used on a front face of the color cathode ray tube uses glass having characteristics in which spectroscopic transmittance to an electromagnetic wave near 580 to 700 nm in wavelength is relatively higher than spectroscopic transmittances to electromagnetic waves near 430 nm and 530 nm in wavelength.

4 Claims, 3 Drawing Sheets

Spectroscopic Transmittance Characteristics
Of Safety Glass

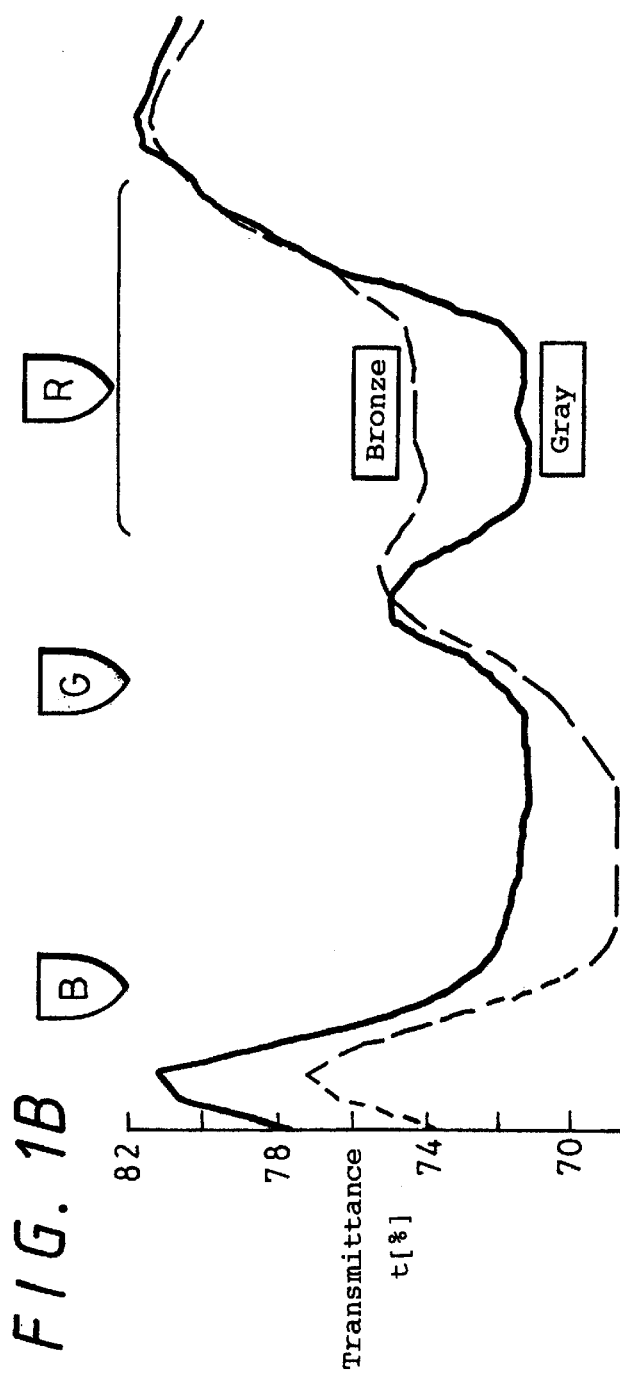
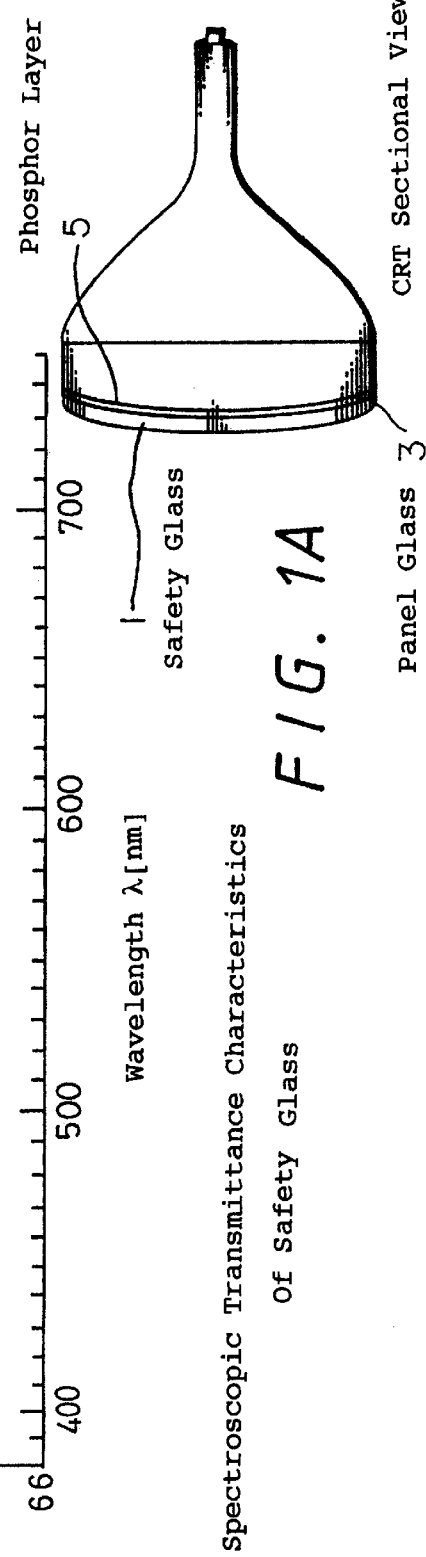
FIG. 1B
FIG. 1A

Transversal Sectional View Of CRT

Partially Enlarged View Of Phosphor Face

Explanatory View Of Reflecting Situation Of External Light

COLOR CATHODE RAY TUBE WITH IMPROVED TRANSMITTANCE OF SELECTIVE WAVELENGTHS

TECHNICAL FIELD

The present invention relates to a color cathode ray tube (hereafter, called a color CRT) suitably used in a color display unit.

BACKGROUND ART

There is conventionally a problem of an increase in brightness in a color CRT particularly used in a high definition display unit such as a computer display and a display unit of a large screen.

A method for increasing a voltage applied to an anode of the CRT, a method for increasing an electronic beam current from a cathode of an electron gun, a method for improving light emitting efficiency of a phosphor itself on a phosphor screen, etc. are known in the prior art for increasing the brightness of the CRT.

However, in the method for increasing the voltage applied to the anode of the CRT, power consumption is increased and there tends to be a critical defect of discharge in the CRT. Further, deflecting efficiency of a deflecting yoke (DY) is reduced and a problem of heat generation of the deflecting yoke is particularly caused in the high definition CRT.

In the method for increasing the electronic beam current from the cathode of the electron gun, a focusing function is generally deteriorated and an emission life of the cathode is shortened, and the life of the electron gun is also shortened. Further, in the high definition CRT, an amplifying circuit of the electronic beam current is formed in a high frequency region and it becomes difficult to increase the electronic beam current itself.

Further, the color CRT basically has three kinds of phosphor stripes (or dots) of red (R), green (G) and blue (B) and light is emitted from the phosphors by hitting the beam from the electron gun against these stripes. If the electronic beam is of high densities as it hits against the phosphor screen in a light emitting region of a visible ray actually used, brightness is correspondingly increased. Namely, it can be said that brightness of a specific phosphor is proportional to the electronic beam current.

However, light emitting efficiencies (bright degrees with respect to the same beam electric current, i.e., brightnesses) of the red, green and blue phosphors are different from each other. The light emitting efficiency of the red phosphor is generally worse than blue and green phosphors with respect to phosphors developed and used at present. Therefore, it is necessary to increase the electronic beam current to increase the red brightness. However, there is also a restriction of the beam electronic current determined from the above-mentioned circuit or the life of the electron gun so that there is a limit in the allowed beam electric current. Accordingly, beam electric currents with respect to green and blue are set such that red, green and blue lights are balanced under a condition in which the red beam electric current is increased as much as possible. Namely, the beam electric currents corresponding to the green and blue phosphors are set to be lower than their allowed maximum electric currents. Thus, the entire brightness of the CRT is actually determined by the red light emitting efficiency.

Further, the method for improving the light emitting efficiency of the phosphor itself on the phosphor screen has been continuously researched conventionally, but has recently attained a maximum state.

It is also considered that brightness can be increased by coating a phosphor layer with a thick coating and relatively increasing a phosphor amount. However, the phosphor stripes on the phosphor screen have recently been thinned to achieve high definition of the CRT so that the phosphor layer is thinned and the phosphor amount is reduced, thereby reducing brightness. FIG. 3B shows a typical phosphor layer of a computer display of 20 inches in size. A size from a phosphor R to the next phosphor R is set to about 0.3 mm. A width wp of each of phosphor stripes of red (R), green (G) and blue (B) seen through a panel glass and a width wc of a carbon stripe are approximately set to about 0.05 mm (50 $\mu$m). There is a constant limit in thickness of the phosphor layer when the phosphors are coated along this very narrow width of 50 $\mu$m.

It is considered, in order to to improve brightness that a ratio of the carbon stripe width $w_c$ and the phosphor stripe width $w_p$ on the phosphor screen can be changed and the carbon stripe width $w_c$ can be thinned and the phosphor stripe width $w_p$ can be correspondingly increased. However, in this case, a color shift results from caused by a slight mislanding (a shift in position between an electronic beam and each of the phosphor stripes) so that an image quality is reduced. In particular, the phosphor stripe width $w_p$ and the carbon stripe width $w_c$ are thin in the high definition CRT so that a marginal degree of error with respect to the mislanding is slight and it is difficult to increase this phosphor stripe width as a trial.

Therefore, it is considered as a trial that the same phosphors are used and brightness of the CRT is improved by increasing transmittance of each of a panel glass 3 and a safety glass (SP safety glass) 1 of the CRT arranged between the phosphors and man's eyes shown in FIG. 3A. However, in this case, a problem of a reduction in contrast by the second power of transmittance is caused so that it is difficult to increase this brightness. Accordingly, general transmittance of the safety glass 1 and the panel glass 3 is generally reduced to about 40 to 80% (these contents will be explained later in detail by using FIG. 3C).

An object of the present invention is to provide a CRT for improving brightness without changing the conventional electron gun, the light emitting layer, etc. in the above-mentioned situation.

DISCLOSURE OF THE INVENTION

In a CRT according to the present invention, both or one of a panel glass and a safety panel glass are used on the front face of a color cathode ray tube uses glass having characteristics in which spectroscopic transmittance to an electromagnetic wave near 580 to 700 nm in wavelength is relatively higher than spectroscopic transmittances to electromagnetic waves near 430 nm and 530 nm in wavelength.

Light emitting efficiencies of the red, green and blue phosphors are different from each other. The light emitting efficiency of the red phosphor among the phosphors used at present is generally worse than that of green and blue phosphors. As mentioned above, both or one of the panel glass and the safety panel glass uses glass having characteristics in which spectroscopic transmittance to an electromagnetic wave near 580 to 700 nm in wavelength is relatively high. Accordingly, light emitted in a red light emitting region efficiently passes through this glass so that brightness of this light can be increased. Red, green and blue lights are balanced in green and blue light emitting regions by increasing beam electric currents since there are margins with respect to the beam electric currents.

BRIEF DESCRIPTION OF THE DRAWINGS

FIG. 1 shows a CRT in accordance with this embodiment, and FIG. 1A shows a transversal sectional view of the CRT and FIG. 1B is a graph showing spectroscopic transmittance characteristics of a safety glass of this CRT.

FIG. 2 is graphically shows an operation and effects of the safety glass used in the CRT in accordance with this embodiment.

BEST MODE FOR CARRYING OUT THE INVENTION

One embodiment of a CRT in accordance with the present invention will next be described with reference to the accompanying drawings. FIG. 1 provides a visual explanation of the CRT in accordance with this embodiment. The CRT in this embodiment shown in FIG. 1A uses a "bronze glass" as a safety glass 1 arranged on the front face of a phosphor screen. The bronze glass used in this embodiment is a single plate glass and a glass classification is set to a heat absorbing plate glass, and a glass kind is set to a bronze vane. Further, a kind abbreviation is set to BZFL3, and visible ray general transmittance can be specifically set to 72.9% (in the case of a plate thickness 3 mm). The other elements such as an unillustrated electron gun, a phosphor layer 5, etc. constituting the CRT are the same as the conventional CRT.

In contrast to this, the conventional CRT uses a "gray glass" as the safety glass. The gray glass is a single plate glass and a glass classification is set to a heat absorbing plate glass and a glass kind is set to a gray vane. Further, a kind abbreviation is set to GRFL3 and visible ray general transmittance is specifically set to 72.4% (in the case of a plate thickness 3 mm).

For example, the bronze glass (this embodiment) and the gray glass (prior art) can be commercially obtained from NIPPON ITA-GLASS Co., Ltd.

FIG. 1B is a graph showing spectroscopic transmittance characteristics (broken line) of the bronze glass used as the safety glass in the CRT in this embodiment. In this figure, the abscissa axis shows a wavelength λ [nm] and the ordinate axis shows transmittance [%]. FIG. 1B simultaneously shows spectroscopic transmittance characteristics (solid line) of the gray glass used in the conventional CRT as a comparison example.

As shown in FIG. 1, transmittance [%] in each of light emitting regions of red, green and blue (RGB) relative to the bronze glass and the gray glass is set as follows.

| Glass kind | B (430 nm) | G (530 nm) | R (580–700 nm) |
|---|---|---|---|
| bronze (this embodiment) | 71.0 | 71.0 | 74.0–80.7 |
| gray (comparison example) | 73.3 | 72.0 | 71.2–80.7 |

It should be understood from FIG. 1B that transmittance of the bronze glass is relatively lower than that of the gray glass in each of the green and blue light emitting regions. It should be also understood that transmittance of the bronze glass is relatively higher than that of the gray glass in the red light emitting region.

It was conventionally normal to select a glass material in which spectroscopic transmittance characteristics of the safety glass are approximately equal in the red, green and blue light emitting regions and no glass material is specifically colored. However, as shown in FIG. 1B, this embodiment is characterized in that a safety glass having spectroscopic transmittance characteristics in a desirable RGB light emitting region corresponding to light emission of each of red, green and blue phosphors is selected.

Figure 2A:
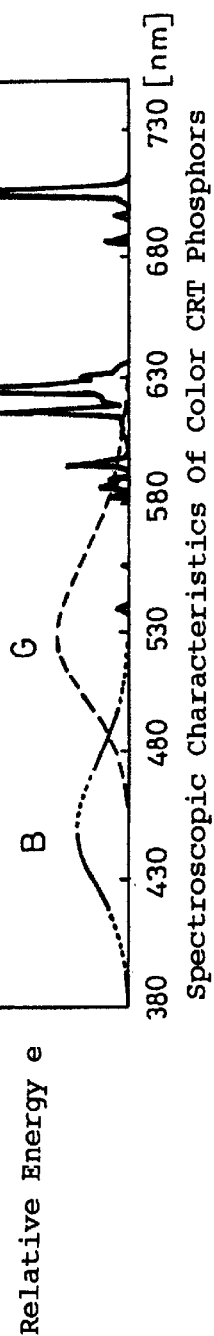
FIG. 2A shows spectroscopic relative energy characteristics of color phosphors RGB and FIG. 2B shows spectroscopic transmittance characteristics of the safety glass similar to those of FIG. 1B.

An operation and effects of the CRT using such a bronze glass as the safety glass of the CRT will next be explained by using FIG. 2. FIG. 2A is a graph showing spectroscopic characteristics (spectrum form) of each of the red, green and blue color phosphors. In this figure, the abscissa axis shows a wavelength λ [nm] of light emitted from each of the phosphors and the ordinate axis shows relative energy e of this emitted light. The red, green and blue phosphors themselves are the same as the conventional ones so that spectroscopic characteristics of these phosphors are the same as the conventional CRT.

Figure 2B:
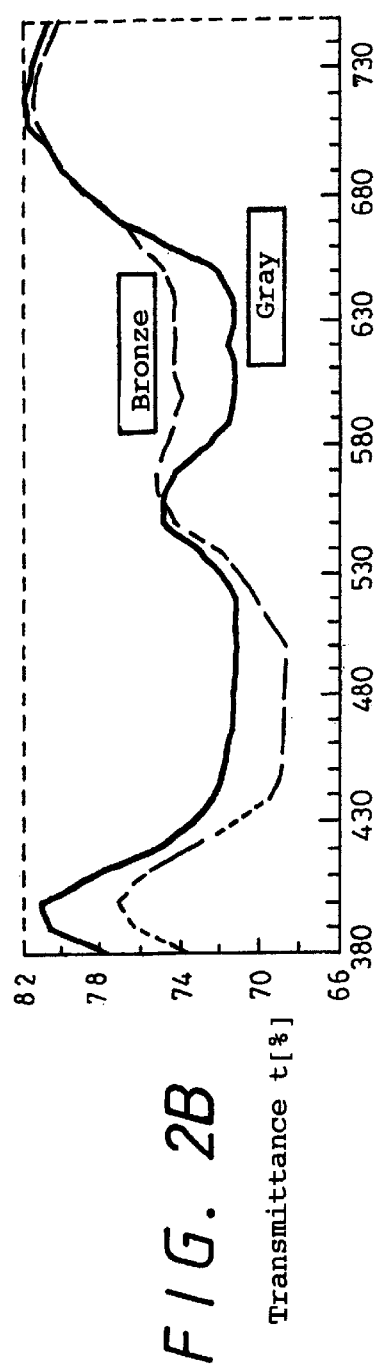

FIG. 2B is similar to the graph of FIG. 1B and shows spectroscopic transmittance characteristics of the safety panel 1. In this figure, the abscissa axis shows a wavelength λ [nm] and the ordinate axis shows transmittance [%]. FIGS. 2A and 2B are arranged such that values of the wavelength λ on the abscissa axes are in conformity with each other in position to easily read the relative energy e of each of the phosphors and the transmittance t of the safety glass with respect to the wavelength λ of light emitted every phosphor.

With reference to FIG. 2A, man's eyes sense a visible ray (an electromagnetic wave from 380 nm to 780 nm in wavelength) as light approximately in an illustrated range of the wavelength λ [nm] on the abscissa axis. A color is sensed by a value of the relative energy (in a spectrum form) on the ordinate axis emitted from each of the phosphors in this range of the wavelength λ. The man's eyes sense an electromagnetic wave near 430 nm in wavelength as a blue color, an electromagnetic wave near 530 nm in wavelength as a green color and sense an electromagnetic wave near 580 to 700 nm in wavelength as a red color.

Accordingly, a characteristic curve having a peak of the relative energy near 430 nm in wavelength shows spectroscopic characteristics of the blue phosphor. A characteristic curve having a peak of the relative energy near 530 nm in wavelength shows spectroscopic characteristics of the green phosphor. A characteristic curve having plural peaks of the relative energy near 580 to 700 nm in wavelength shows spectroscopic characteristics of the red phosphor.

If an area (an integral value of the spectroscopic characteristic curve) at each of the peaks is large in FIG. 2A, light is basically sensed brightly, namely, brightness of this light is high. Further, if each of the peaks is thin, the light colors are clearly seen, namely, color purity becomes high. In contrast to this, if each of the peaks is thick, the light colors become impure and the red phosphor looks impure whitish red, the green phosphor looks impure whitish green and the blue phosphor looks impure whitish blue. Namely, the color purity is reduced.

Next, please see the spectroscopic transmittance characteristics of the safety glass shown in FIG. 2B. In this embodiment, the bronze glass is used as the safety glass so that spectroscopic characteristics of this bronze glass are different from the conventional spectroscopic characteristics. As explained by using FIG. 1, it should be understood with respect to transmittance of the bronze glass (in this embodiment) relative to each of the red, green and blue light emitting regions that the transmittance of the bronze glass is relatively lower than that of the gray glass (in the conventional example) in each of the green and blue light emitting regions. It should be also understood that the transmittance of the bronze glass is relatively higher than that of the gray glass in the red light emitting region.

The following effects are provided with respect to a viewer seeing light emitted from each of the red, green and blue phosphors through the safety glass having the spectroscopic transmittance characteristics of FIG. 2B by using this safety glass.

(1) In the red light emitting region having the worst light emitting efficiency, the red phosphor itself is the same as the conventional one so that light emitting energy $e_R$ of this red phosphor is the same as the conventional one. However, when this emitted light is seen through the bronze glass relatively high in transmittance $t_R$ in the red light emitting region, this emitted light can look relatively bright in comparison with a case in which this emitted light is seen through the conventional gray glass.

(2) The green and blue phosphors are the same as the conventional ones in the green and blue light emitting regions having relatively good light emitting efficiency so that light emitting energies $e_G$ and $e_B$ of these green and blue phosphors are respectively the same as the conventional ones. However, when these emitted lights are seen through the bronze glass relatively low in transmittances $t_G$ and $t_B$ in the green and blue light emitting regions, these emitted lights look relatively dark in comparison with a case in which these emitted lights are seen through the conventional gray glass.

Conventionally, a beam electric current is maximized as much as possible in the red light emitting region and beam electric currents are respectively set to be low in the green and blue light emitting regions by balancing these beam electric currents with respect to red brightness at this time. In this embodiment, viewer's eyes see the red brightness as if the red brightness is increased, and see green and blue brightnesses as if these green and blue brightnesses are decreased in comparison with the conventional case. Accordingly, each of the green and blue beam electric currents is increased to brighten each of green and blue lights in comparison with the conventional case so as to balance the red, green and blue brightnesses. Each of the green and blue beam electric currents is not a maximum electric current as mentioned above, but has a margin so that each of these beam electric currents can be increased. Thus, each of the red, green and blue brightnesses is increased by an increase in the red brightness (seen by the viewer's eyes) and increases in the green and blue brightnesses provided by increasing the green and blue beam electric currents (to compensate an increase in brightness provided by a rise in transmittance of the bronze glass relative to the red light emitting region and a reduction in brightness caused by a reduction in transmittance of the bronze glass relative to the green and blue light emitting regions). Thus, brightness of the CRT is increased as a whole.

This increase in brightness will be next confirmed by making a calculation. There are D65 (average white of sun light, about 6500 K in color temperature) and D93 (slight bluish white in consideration of general taste, about 9300 K in color temperature) with respect to reference white in an NTSC system. With respect to calculated results using D93, transmittance is 0.739 when transmittance is set to 1.0 at a nonexisting time of the safety panel and the bronze glass (this embodiment) is used. Further, transmittance is 0.715 when transmittance is set to 1.0 at the nonexisting time of the safety panel and the gray glass (prior art) is used. Accordingly, the red brightness, namely, white brightness is increased by 0.739/0.715=1.0336.

In this embodiment, color purity is relatively improved in comparison with the prior art. This explanation will next be described. This color purity is improved in the red light emitting region. As shown by a spectroscopic characteristic curve of each of the phosphors in FIG. 2A, there are plural peaks of relative energy $e_R$ near 580 to 700 [nm] in wavelength in the red light emitting region. As mentioned above, with respect to the color purity, light looks bright if a peak of the relative energy is thin. Namely, the color purity becomes high. Accordingly, the red color purity is improved if transmittance $t_R$ relative to a peak at 580 to 640 [nm] in wavelength is increased, or if transmittance $t_R$ relative to a peak at 680 to 710 [nm] in wavelength can be decreased.

As shown in FIG. 2B, in the CRT using the bronze glass as the safety glass in this embodiment, transmittance (about 80 to 81.5%) with respect to a peak in a region from 680 to 720 [nm] in wavelength is equal to transmittance of the conventional gray glass. However, transmittance (about 74.0 to 74.5%) with respect to a peak in a region from 590 to 640 [nm] in wavelength is relatively high in comparison with transmittance (about 71.0 to 71.6%) of the conventional gray glass. Namely, transmitted light of the red phosphor in the region from 590 to 640 [nm] is relatively large in the bronze glass according to this embodiment in comparison with the gray glass. Therefore, it should be understood that an influence of the transmitted light of the red phosphor in the region from 580 to 640 [nm] in wavelength is relatively reduced. As a result, the color purity is improved in the red light emitting region.

Brightness of the CRT is normally measured with white prescribed by D93 or D65. This white is conventionally obtained when light is approximately emitted in a ratio of R:G:B=2:7:1. When the red color purity can be increased as in this embodiment, a net red light portion is increased so that a red ratio can be relatively reduced. For example, it is assumed that the same white can be obtained in a ratio of 1.8:7.1:1.1. Red light can be conventionally brightened until a brightness corresponding to value 2. Therefore, the ratio of (1.8:7.1:1.1) can be entirely multiplied by 2/1.8=1.1 times. Accordingly, in this case, general brightness, namely, white brightness is multiplied by 1.1 times by the improvement of the color purity.

Thus, the use of the bronze glass having relatively high transmittance in the red light emitting region is similar to an application of a band pass filter to a spectrum of the red light emitter. Accordingly, the red color purity is improved so that brightness is increased.

The increase in brightness caused by this color purity is confirmed by making a calculation. The red brightness is calculated by paying attention to chromaticity at a time of white 100 [cd/m$^2$] of D93. This red brightness is 21.3 in the case of the bronze glass and is 21.8 in the case of the gray glass. Accordingly, when the red brightness is set to 100 [cd/m$^2$] in use of the conventional gray glass, the red brightness is increased by 2.35% from 100 × (21.8/21.3)= 102.35 [cd/m$^2$] in the case of the bronze glass.

These effects of the increases in transmittance and color purity in total provide 102.35 [cd/m$^2$] ×1.0336=105.7 [cd/m$^2$]. Finally, the brightness is increased by 5.7%. Namely, the increase in brightness has also been confirmed by making a calculation. It is also confirmed in the case of D65 that brightness is increased by 5.0% by making a similar calculation.

Contrast will next be considered. A CRT image quality greatly depends on a ratio of a highlight brightness and a black level brightness on the screen, i.e., a contrast ratio. The image quality is reduced if contrast C is reduced even when brightness is increased. The contrast C is represented as follows.

C=brightness of CRT/brightness of light reflected on the CRT screen

=brightness of CRT/(external light x reflectivity)

Figure 3A:
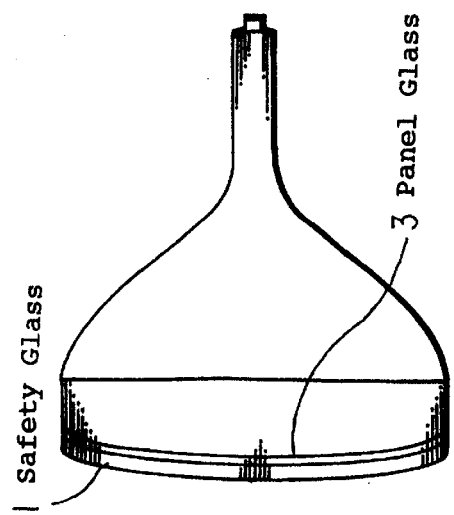
FIG. 3A is a transversal sectional view of the CRT.
Figure 3B:
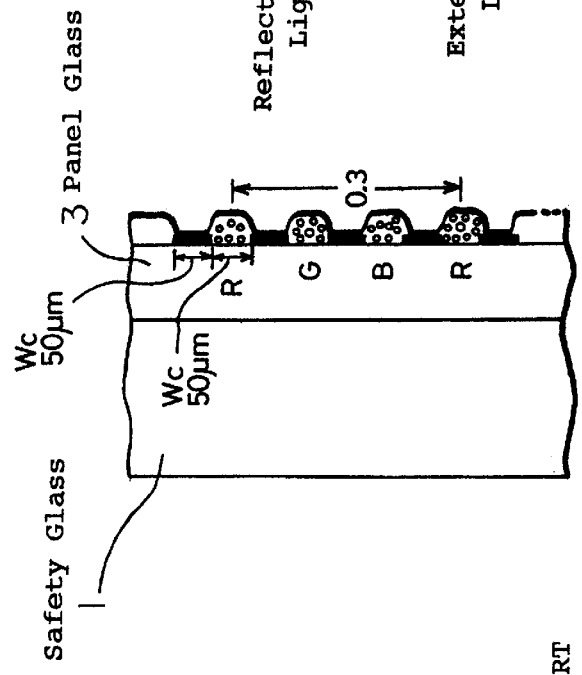
FIG. 3B is a partially enlarged view of a safety glass, a panel glass and a phosphor layer.
Figure 3C:
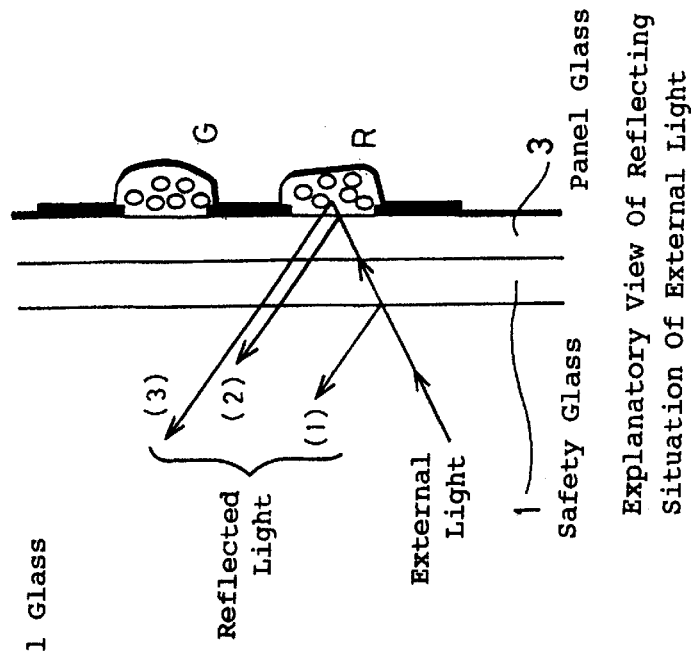
FIG. 3C is a view for explaining a reflecting state of an external light beam.

As shown in FIG. 3C, when the CRT with a safety glass is seen and external surrounding light (external light) such as interior illumination, etc. is incident to the screen, reflected light (1) on a safety glass surface, reflected light (2) on the surface of a panel glass 1 on a phosphor layer side, and reflected light (3) on the phosphor are caused. The reflected light (2) and the reflected light (3) are mixed with light emitted from a phosphor surface. Accordingly, the black level brightness is increased so that the contrast ratio is apparently reduced, thereby causing a problem.

In this case, the reflected lights (2) and (3) passing twice through the panel glass and the safety glass in going and returning are damped (namely, reflectively is reduced) in the second power of transmittance by reducing transmittances of the panel glass and the safety glass 1 in the CRT so that the contrast C is improved. (Accordingly, the safety glass and the panel glass are generally used in a state in which general transmittance of the safety glass and the panel glass is reduced to about 40 to 80%. This is because a CRT having a reduced transmittance called a black face is used.) In this embodiment, ;the general transmittance in the case of the bronze glass is approximately equal to that in the case of the gray glass. Accordingly, the contrast C is increased by the above-mentioned increase in brightness of the CRT. Strictly speaking, transmittance of the bronze glass is higher by 0.33% than that of the gray glass. However, it is considered that there is no influence of this difference since it can be expected that brightness is improved by about 5%.

Thus, in this embodiment, the red light emitting efficiency is relatively low in comparison with the green and blue light emitting efficiencies in the red, green and blue phosphors developed at present. Therefore, the red, green and blue phosphors use a safety glass in which spectroscopic transmittance of the safety glass in the red light emitting region is relatively higher than each of spectroscopic transmittances of the safety glass in the green and blue light emitting regions. A beam electric current with respect to the red phosphor is set to be high as much as possible. Each of beam electric currents with respect to the green and blue phosphors is set by balancing the red brightness and the green and blue brightnesses.

In this embodiment, the safety glass is explained, but the panel glass is similar to the safety glass in that the panel glass is arranged between the phosphor layer 5 and a viewer. Accordingly, the matters relative to the glass transmittance explained with respect to this embodiment can be also applied to both or one of the safety glass and the panel glass.

It is conventionally considered that two kinds of beam electric currents ($i_R$, $i_G$, $i_B$) and light emitting energies (brightnesses) ($e_R$, $e_G$, $e_B$) of the phosphors are parameters with respect to the CRT brightness. However, this embodiment is characterized in that it is found that the improvement of brightness can be achieved by adjusting transmittances $t_R$, $t_G$ and $t_B$ of the safety glass. It can be said that this embodiment is a technique for compensating dispersions between the light emitting energies (brightnesses) $e_R$, $e_G$ and $e_B$ of the present phosphors by transmittances $t_R$, $t_G$ and $t_B$ of the safety glass. Accordingly, the essence of the present invention is considered as follows.

There is a possibility that a development relative to the improvement of the brightnesses of the red, green and blue phosphors themselves is advanced by engineers skilled in the art in the future, and a balance of the light emitting efficiencies of the red, green and blue phosphors in the future is different from the present balance. In the future, for example, the light emitting energy $e_R$ of the red phosphor might become relatively higher than the light emitting energies $e_G$ and $e_B$ of the green and blue phosphors. In this case, the CRT brightness can be improved by selecting a safety glass having a transmittance ratio $t_R:t_G:t_B$ respectively approximately proportional to a ratio $1/e_R:1/e_G:1/e_B$ of inverse numbers of the light emitting energies (brightnesses) of the respective phosphors.

Further, if optical characteristics of glass can be freely controlled in the future, the following operation is considered. The contrast C is represented as follows.

C=brightness of CRT/(external light x reflectivity) In general, an image quality is preferable when the contrast C is high. In the embodiment described so far, reflectivities are approximately the same and the contrast C is improved by improving the CRT brightness. However, in the future, if glass having transmittance higher by 5% can be obtained without changing the contrast C (since the CRT brightness, the external light and the reflectivity are respectively independent variables), $1.05^2=1.10$, i.e., a CRT having a brightness increased by 10% is obtained from brightness of CRT=contrast C×(external light x reflectivity) since the reflectivity is proportional to the second power of transmittance as explained with reference to FIG. 3C.

Further, the CRT brightness can be improved by adjusting three kinds of parameters of the above beam electric currents, the light emitting energies (brightnesses) and transmittances of the safety glass. The respective beam electric currents $i_R$, $i_G$ and $i_B$ are desirably equal to each other or close to each other as much as possible in view of life of an electron gun. The light emitting energies (brightnesses) $e_R$, $e_G$ and $e_B$ of the phosphors are desirably close to each other as much as possible or are desirably set to values in a desirable ratio in view of generation of other colors such as white, etc. Further, the transmittances $t_R$, $t_G$ and $t_B$ of the safety glass are desirably equal to each other or close to each other as much as possible in view of prevention of accidental coloring caused by glass transmission of light.

Finally, it is considered that values of these three kinds of parameters between red, green and blue are adjusted to balance desirable red, green and blue brightnesses at a developing time point of the CRT by providing a priority order of the parameters according to needs at this time point, a technical situation of glass, phosphors, etc. and fixedly providing a parameter having a relatively high priority order, and varying a parameter having a relatively low priority order.

In the above-mentioned explanation, the present invention is not limited to the above embodiment. A technical range of the present invention is determined on the basis of the description of claims.

In accordance with the present invention, brightness of the CRT can be further improved.

We claim:

1. A color cathode ray tube characterized in that both or one of a panel glass and a safety panel glass used on a front face of the color cathode ray tube uses glass having characteristics in which spectroscopic transmittance to every electromagnetic wave near 580 to 700 nm in wavelength is relatively higher than spectroscopic transmittances to any electromagnetic waves near 430 nm and 530 nm in wavelength.

2. The color cathode ray tube as claimed in claim 1, wherein said glass is constructed of bronze glass.

3. A color cathode ray tube in which, when a ratio of relative energies of red, green and blue phosphors of a phosphor layer is $e_R:e_G:e_B$, glass having a transmittance ratio $t_R:t_G:t_B$ in respective red, green and blue light emitting regions approximately proportional to a ratio $1/e_R:1/e_G:1/e_B$ of the respective relative energy values of said phosphors is selected as both or one of a panel glass and a safety panel glass.

4. The color cathode ray tube as claimed in claim 3, wherein said glass comprises bronze glass.

* * * * *

UNITED STATES PATENT AND TRADEMARK OFFICE
CERTIFICATE OF CORRECTION

PATENT NO.    : 5,977,701
DATED         : November 2, 1999
INVENTOR(S)   : Atsushi Sakata et al.

Page 1 of 1

It is certified that error appears in the above-identified patent and that said Letters Patent is hereby corrected as shown below:

<u>Column 9, claim 3,</u>
Line 3, should read:
A color cathode ray tube as set forth in claim 1, wherein, when a ratio of relative energies of red, green and blue phosphors of a phosphor layer is $e_R:e_G:e_B$, glass having a transmittance ratio $t_R:t_G:t_B$ in respective red, green and blue light emitting regions approximately proportional to a ratio $1/e_R:1/e_G:1/e_B$ of the respective relative energy values of said phosphors is selected as both or one of a panel glass and a safety panel glass.

Signed and Sealed this

Ninth Day of April, 2002

*Attest:*

*Attesting Officer*

JAMES E. ROGAN
*Director of the United States Patent and Trademark Office*